United States Patent [19]

Grohrock

[11] Patent Number: 5,024,329

[45] Date of Patent: Jun. 18, 1991

[54] LOCKABLE CONTAINER FOR TRANSPORTING AND FOR STORING SEMICONDUCTOR WAFERS

[75] Inventor: Peter Grohrock, Hoehenkirchen-Siegertsb, Fed. Rep. of Germany

[73] Assignee: Siemens Aktiengesellschaft, Berlin and Munich, Fed. Rep. of Germany

[21] Appl. No.: 322,112

[22] Filed: Mar. 13, 1989

[30] Foreign Application Priority Data

Apr. 22, 1988 [DE] Fed. Rep. of Germany ....... 3813674

[51] Int. Cl.⁵ ............................................. B65D 1/04
[52] U.S. Cl. ..................................... 206/454; 206/328; 206/334; 141/98
[58] Field of Search ............... 206/328, 334, 454, 455, 206/583, 329; 215/341, 343, 344; 211/41, 40; 141/98

[56] References Cited

U.S. PATENT DOCUMENTS

| | | | |
|---|---|---|---|
| 3,814,274 | 6/1974 | McIntosh | 215/344 |
| 4,091,948 | 5/1978 | Northup | 215/344 |
| 4,582,219 | 4/1986 | Mortensen et al. | |
| 4,609,103 | 9/1986 | Bimer et al. | 206/454 |
| 4,739,882 | 4/1988 | Parikh et al. | 206/334 |
| 4,804,086 | 2/1989 | Grohrock | 206/328 |
| 4,830,182 | 5/1989 | Nakazato et al. | 206/334 |
| 4,842,136 | 6/1989 | Nakazato et al. | 206/334 |

FOREIGN PATENT DOCUMENTS

| | | |
|---|---|---|
| 688450 | 3/1967 | Belgium. |
| 0151336A3 | 8/1985 | European Pat. Off. . |
| 9273226A2 | 7/1988 | European Pat. Off. . |
| WO86/00870 | 2/1986 | World Int. Prop. O. . |
| WO87/04043 | 7/1987 | World Int. Prop. O. . |

OTHER PUBLICATIONS

Document #1332, "Standard Mechanical Interface for Wafer Cassette Transfer", Semiconductor Equipment and Materials Institute, Inc., Jan. 10, 1986.
SMIF-Pod, "The Nucleus of the ASYST-SMIF System", and ASYST SMIF-POD System Specifications, Asyst Technologies.

Primary Examiner—David T. Fidei
Attorney, Agent, or Firm—Hill, Van Santen, Steadman & Simpson

[57] ABSTRACT

A container for transporting and for storing semiconductor wafers situated in processing cassettes comprises a bottom plate, a hood, a locking lever and a seal element that is provided between the hood and the bottom plate. In order to avoid contamination of the semiconductor wafers during transport and during storage, the container is of such a nature that it is particle-tight and itself releases only a minimum of particles. The semiconductor wafer securing arrangement is movable on the basis of film hinges and is mechanically moved by the bottom plate when opening and closing the container, whereby no sliding friction occurs.

29 Claims, 4 Drawing Sheets

LOCKABLE CONTAINER FOR TRANSPORTING AND FOR STORING SEMICONDUCTOR WAFERS

BACKGROUND OF THE INVENTION

The present invention relates to a container for transporting and for storing semiconductor wafers situated in processing cassettes. More particularly, the present invention relates to containers comprising a bottom plate, a hood and means for non-positive locking of the hood and the bottom plate.

In semiconductor manufacture, semiconductor wafers are manufactured and further-processed under clean room conditions. Containers whose interior offers a clean room climate are therefore necessary for storing the semiconductor wafers and for transporting the semiconductor wafers to the various processing locations. To that end, the containers should be optimally tight and should not release any contaminating substances, for example exhalations of material, themselves.

Standardization rules for transport containers as recited in the publication of Document No. 1332 of Semiconductor Equipment and Materials Institute dated 10 Jan. 1986 serve the purpose of defining containers that are interchangeable, that comprise standardized dimensions for robot manipulation and that are suitable for the acceptance of standardized processing cassettes.

This publication also provides recommendations concerning the demands that the component parts of a transport container should meet. The recommended standardizations are summarized under the term "Standard Mechanical Interface for Wafer Cassette Transfer" standard (SMIF Standard).

A lockable container for transporting and for storing semiconductor wafers situated in processing cassettes comprising a bottom plate, a hood and at least two locking levers for non-positive locking of the hood and the bottom plate that meets the SMIF Standard is disclosed by U.S. Pat. No. 4,582,219. This container comprises a rigid semiconductor wafer holder secured to the inside wall of the hood, this holder touching the semiconductor wafers situated in the processing cassette when the container is in its closed condition. Given a closed container, further, the semiconductor wafer holder is also held by a lock situated at the bottom plate. One disadvantage of this container is that it comprises component parts that are fashioned such that they cause friction when opening and closing the container and during transport, whereby contaminating particles can be released. Moreover, the container does not comprise any seal element between bottom plate and hood that ensures the particle tightness of the container. When closing the container, the projecting edge of the bottom plate is merely pressed against the edge of the hood by the spring power of the locking levers.

European Patent Application 87117836.4 also discloses a transport container for transporting and for storing semiconductor wafers situated in a semiconductor wafer cassette. Although this transport container can be closed in a dust-tight fashion and comprises a friction-free semiconductor wafer holder, it has an involved, complex design comprising an interchangeable, bipartite inside container.

Transport containers for semiconductor wafers that are particle-tight, contamination-free, meet the SMIF Standard and are distinguished by a simple structure at the same time are not previously known.

SUMMARY OF THE INVENTION

It is an object of the invention to provide a container for transporting and for storing semiconductor wafers situated in a processing cassette that protects the semiconductor wafers against contamination due to the environment, does not release any particles during loading and unloading that contaminate the semiconductor wafers and that comprises a simple structure. The container should also be capable of being designed according to the rules of the SMIF Standard.

In a container of the type initially described, this object is achieved in that
 (a) a seal element for air-tight closing of the container is provided between a hood and a bottom plate; and
 (b) a semiconductor wafer securing means, movable by film hinges and secured to the inside wall of the hood is provided; this securing means is moved into securing position by contact with the bottom plate when the container is closed.

The developments and improvements include but are not limited to:
 (a) A seal element between the hood and the bottom plate comprising a surface sealing lip attached to the bottom plate, and an opposing sealing surface integral to the hood.
 (b) A seal element between the hood and the bottom plate comprising an elastically deformable sealing ring covered by a film strip; film strip being not-tensed and acting to raise the pressure in the container when the container is closed.
 (c) A semiconductor wafer securing means comprising an attachment plate, a securing plate and a guide plate. These plates movably connected by film hinges to each other and the attachment plate connected to the inside surface of the hood. The guide plate contacts the bottom plate upon closure of the container.

Further developments and improvements of the invention are set forth in the following description provided below with reference to exemplary embodiments.

Although modifications and changes may be suggested by those skilled in the art, it is the intention of the inventor to embody within the patent warranted hereon all changes and modifications as reasonably and properly come within the scope of his contribution to the art.

BRIEF DESCRIPTION OF THE DRAWINGS

Eight figures shall be considered with reference to the exemplary embodiments set forth below, these figures being executed as schematic illustrations.

DESCRIPTION OF THE PREFERRED EMBODIMENTS

Figure 1:
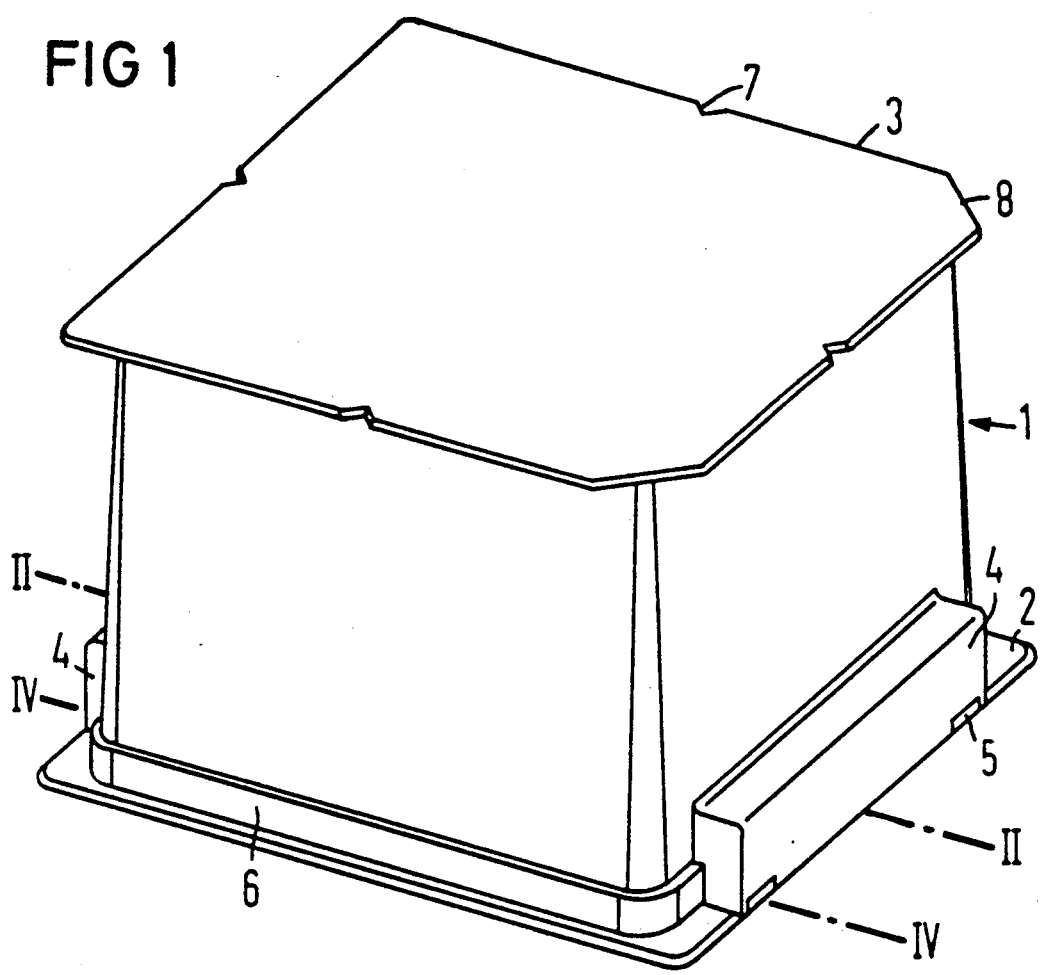
FIG. 1 shows a closed container in a perspective view.

FIG. 1 illustrates an embodiment of a container incorporating the principles of the present invention. The dimensions of the container are selected such that they meet the SMIF Standard. To that end, a hood 1 is shaped such that, given a closed container, a bottom plate 21 (FIG. 2) is arranged mortised into a lower edge region 6 of the hood. Shaped portions 4 provided at opposite sides of the hood 1 serve for the acceptance of locking levers 50 (see FIG. 3 and FIG. 4), whereby recesses 5 for receiving projecting edges 42 are provided. A projecting, upper hood edge 3 that comprises notchings 7 and partly rounded corners 8 and a projecting or salient lower hood edge 2 are designed for the manipulation of the container with robots.

Figure 2:
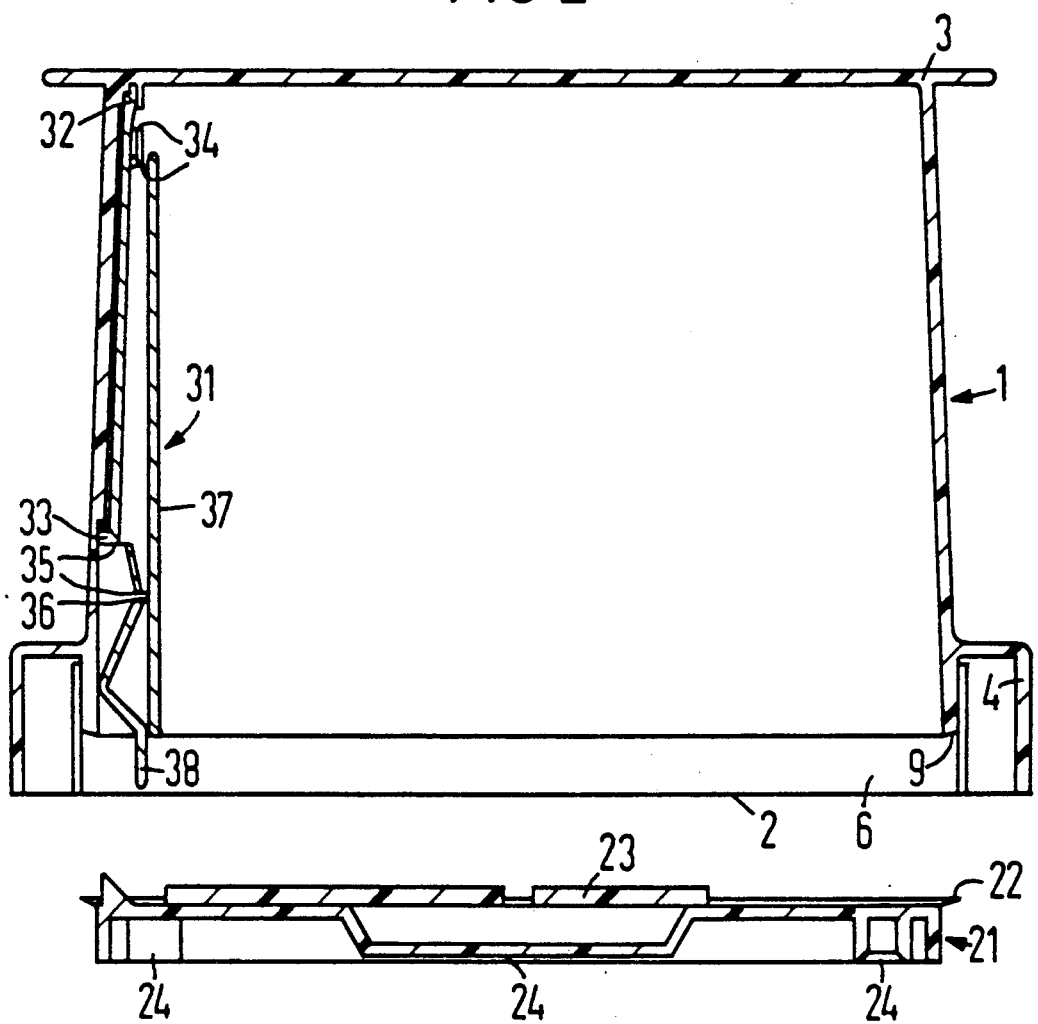
FIG. 2 shows the hood of the container of FIG. 1 and a bottom plate as sectional views generally along the line II—II entered in FIG. 1.

The interior of the container is shown in greater detail in FIG. 2 wherein dimensions of the bottom plate 21 are matched such to those of the hood 1 that the bottom plate 21 is mortised in the lower edge region 6 of the hood 1 when the container is closed. Elevations 23 on the upper side of the bottom plate 21 serve the purpose of locking a processing cassette filled with semiconductor wafers (not shown in the figure) residing on the bottom plate 21, and are matched to the dimensions of the processing cassette employed. Given automatic opening of the container, the bottom plate 21 can fulfill the function of a door that, after the locking levers 50 (see FIG. 3 and FIG. 4) have been opened, is withdrawn perpendicularly down from the hood 1 while the hood 1 is held at the salient, lower edge 2. Bottom plate 21 is withdrawn together with the processing cassette residing on it. Various formed portions 24 are provided at the underside of the bottom plate 21, these being designed for machine manipulation when opening and closing the container. The bottom plate 21 comprises an all-around sealing lip 22 that projects over the edge of the bottom plate 21 and is firmly joined thereto, this sealing lip 22 being composed of the same material of which the bottom plate 21 is manufactured. The shape of the sealing lip 22 and of a sealing surface 9 of the hood 1 are designed such that surface pressure is constant over the area of the sealing lip when the container is closed. Optimum tightness is thereby achieved, as is a long useful life of the sealing lip as a result of low wear.

A semiconductor wafer securing means 31 is provided for semiconductor wafers (not shown in the figure) arranged vertically above one another in a processing cassette.

The semiconductor wafer securing means 31 is interchangeably attached to an inside surface of the hood 1 on the basis of two nub-depression joints 32, 33. The semiconductor securing means 31 comprises a securing plate 37 movably suspended by film hinges 34, 35, 36; this securing plate being brought into position by a guide plate 38 residing in contact with the bottom plate 21 when the container is closed. The movement of the semiconductor wafer securing means 31 when the container is opened and closed ensues without the occurrence of sliding friction that could release particles that contaminate the semiconductor wafers. The dimensions of the semiconductor wafer securing means 31 and the positioning of the processing cassette are selected such that the semiconductor wafer securing means 31 does not touch the semiconductor wafers in the closed condition of the container. The distance between the securing plate 37 of the semiconductor wafer securing means 31 and the semiconductor wafers given a closed container can, for example, be 0.1 mm through 1 mm and can, for example, be approximately 3 mm during loading and unloading. The semiconductor wafer securing means 31 should not touch the semiconductor wafers in the normal case but should hold their ability to move laterally within limits given the occurrence of increased, horizontal accelerations.

Since the materials of which the container components are manufactured should release optimally few contaminating particles, it is expedient to manufacture all container components of plastics that are free of exhalations. In order to avoid static charges that could damage electron components and circuits, it is advantageous to manufacture the inside region of the container of anti-static material. Plastics that meet these demands are carbon-laced polypropylene and polycarbonate. A further advantage in employing plastic materials is the possibility of manufacturing colored or transparent parts. For example, the hood 1 of the container can be manufactured of transparent, ultraviolet-impermeable plastic, whereby opening of the container for inspecting its contents that involves a risk of producing contaminations becomes superfluous. By employing only plastic materials, metal contaminations of the semiconductor wafers are avoided. The resistance to abrasion of plastic material is also important, particularly for the semiconductor wafer securing means. For example, polyethylene is extremely well-suited for manufacturing the semiconductor wafer securing means that comprises thin material strips as film hinges.

Figure 3:
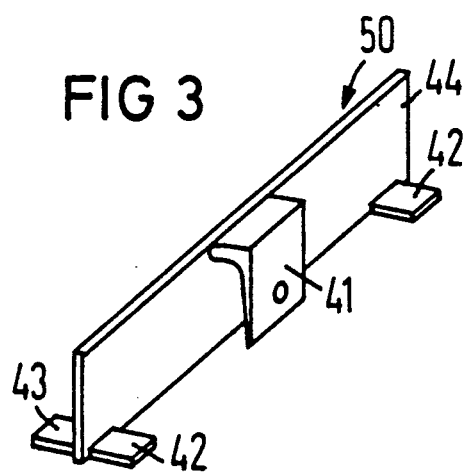
FIG. 3 shows a locking lever for closing the hood and the bottom plate of FIG. 2 in a perspective view.
Figure 4:
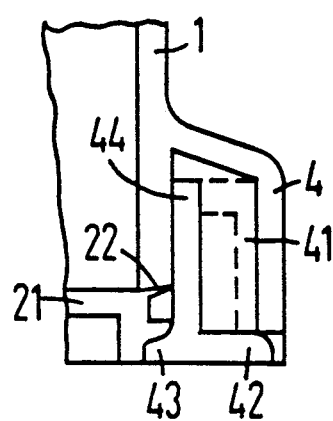
FIG. 4 shows a portion of a section of the closed container of FIG. 1 comprising the bottom plate of FIG. 2 generally along the section line IV—IV of FIG. 1.
Figure 5:
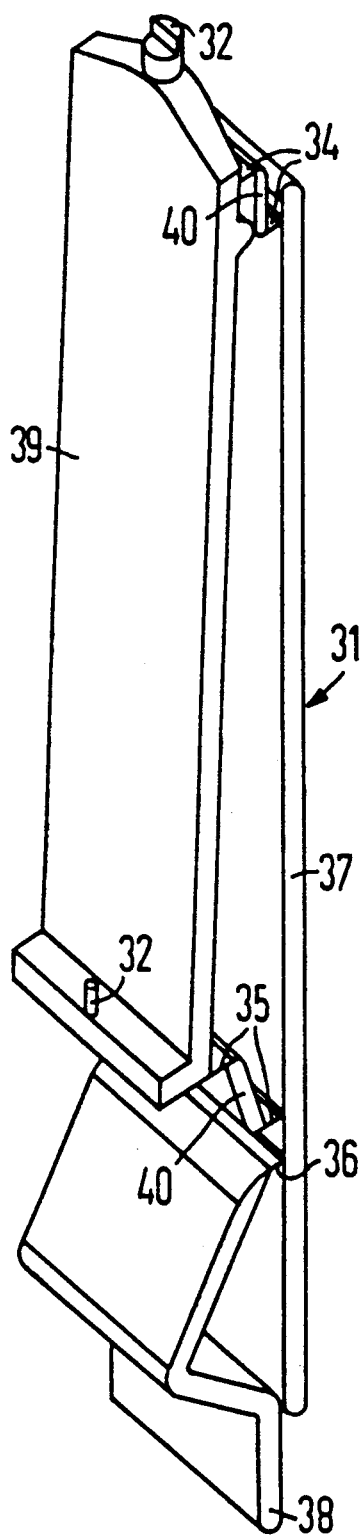
FIG. 5 shows the semiconductor wafer securing means of FIG. 2 in a perspective view.

In FIGS. 3 and 4, the locking lever 50 is shown which comprises two projecting edges 42 that engage into the recesses 5 of the hood 1 when the container is closed. Projecting edges 43 that engage into corresponding recesses of the bottom plate 21 are provided at the opposite side of the locking lever. Both lever arm 41 and lever link 44 are resilient elements FIG. 5 illustrates the semiconductor wafer securing means 31 which comprises a fastening plate 39 that can be interchangeably secured to two positions on the inside surface of the hood 1 of the container by means of nubs 32. The securing plate 37 is movably attached to the fastening plate 39 via two articulated plates 40 each of which comprises two film hinges 34, 35. The guide plate 38 that is secured to the securing plate 37 by a film hinge 36 is shaped such that it converts the vertical motion of the bottom plate 21 that occurs when the container is closed into a horizontal motion of the securing plate 37. As a result of this novel design of the semiconductor wafer securing means in the container, no additional particles are released when semiconductor wafers are loaded into the container or unloaded from the container. The film hinges comprise a thickness of less than 0.2 mm for optimum functionability.

Figure 6:
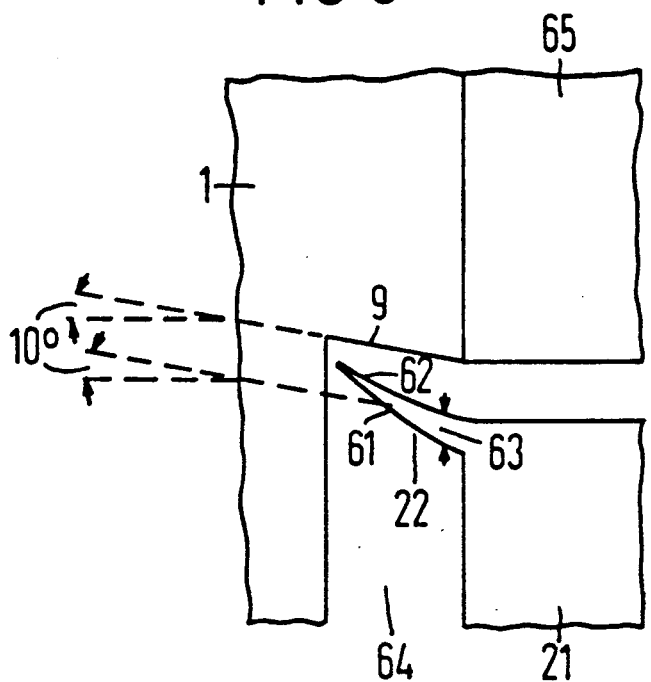
FIG. 6 shows a section through the seal element shown in FIG. 2 and shows a sealing lip when the container is nearly closed.

In FIG. 6, the sealing lip 22 is shown rigidly joined to the bottom plate 21. Universally known plastic processing methods make it possible to manufacture the bottom plate 21 together with the sealing lip 22 of one piece, for example of polypropylene or of polycarbonate. The sealing lip 22 is shaped such that the surface pressure over the area of the sealing lip is constant when the container is closed. This can be achieved in that a thickness 63 of the sealing lip 22 measured in the direction of pressing power tapers parabolically in an outward direction, whereby an upper, inside surface 62 and a lower, outside surface 61 of the sealing lip 22 have different curvatures. Since the sealing surface 9 of the hood 1 drops at an angle of about 10° from the horizontal toward the interior 65 of the container and the sealing lip 22 projects beyond the upper edge of the bottom plate 21 with an angle greater than 10°, the sealing lip 22 cannot snap over when the sealing lip 22 is pressed against the sealing surface 9.

Figure 7:
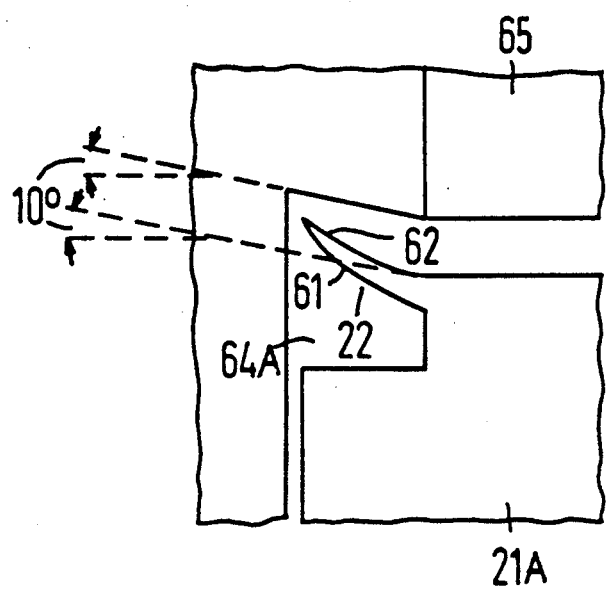
FIG. 7 shows a section through a seal element comprising a sealing lip in a different embodiment of the bottom plate.

FIG. 7 illustrates alternative embodiments of the container wherein a bottom plate 21A is shaped broadened under the projecting sealing lip 22, so that a space 64A formed under the sealing lip 22 is reduced in size in comparison to a space 64 under the sealing lip as shown in the embodiment in FIG. 6.

Figure 8:
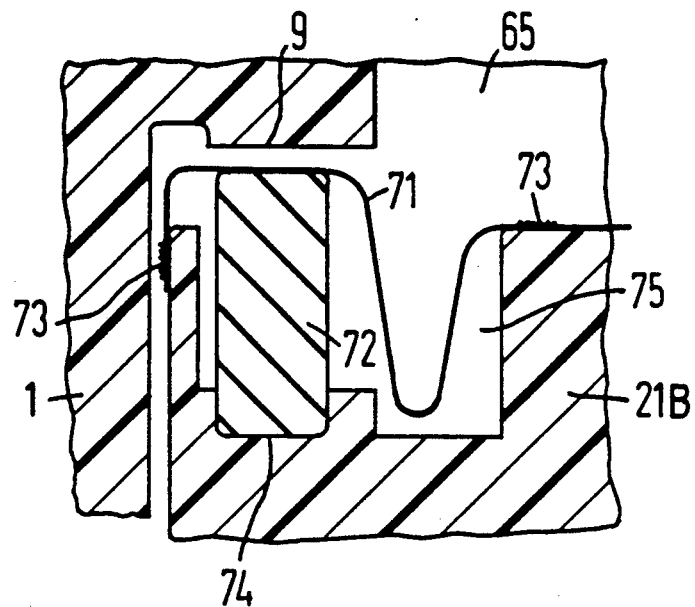
FIG. 8 shows a section through a seal element comprising an elastically deformable seal ring when the container is nearly closed.

It is provided in a further development of the invention, as shown in FIG. 8, that an elastically deformable sealing ring 72 be arranged as a seal element between the sealing surface 9 of the hood 1 and a bottom plate 21B, this sealing ring 72 being covered with a strip of flexible, low-abrasion film 71 of, for example, plastic. The plastic film 71 thereby protects the interior 65 of the container against contamination due to the substances emitted by the sealing ring 72. The sealing ring 72 can thereby be guided in a channel 74 provided in the bottom plate 21B. The plastic film 71 can be secured to the surface and the outside edge of the bottom plate 21 by bonded plastic connections 73. Further advantages are offered by an arrangement wherein the plastic film 71 forms a hermetically closed, air-filled cavity 75 with the bottom plate 21B and the sealing ring 72 and is not tensed in either the open or closed position of the container. When the container is closed, such an arrangement experiences an elevation of the pressure in the cavity 75, this, given pressure equalization with the interior 65 of the container via the flexible plastic film 71, increasing the interior pressure of the container. The interior pressure of the container can thereby be increased by about 10 mbar.

Figure 9:
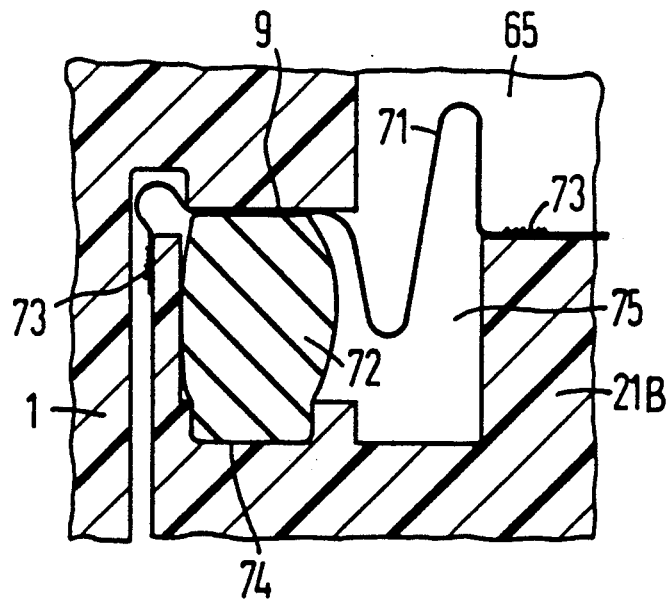
FIG. 9 shows the seal element of FIG. 8 when the container is closed.

FIG. 9 illustrates a closed container wherein the sealing ring 72 is compressed and the plastic film 71 is partly inverted into the interior 65 of the container due to the over-pressure in the cavity 75. A pressure equalization between the cavity 75 and the interior 65 of the container is produced in this condition. The sealing ring can be an expanded plastic part. The compression properties are optimum given a Shore hardness of about 5°. A polyethylene film having a thickness of about 0.2 mm excellently meets the demands made of the film.

I claim as my invention:

1. A container for transporting and storing semiconductor wafers in processing cassettes, comprising:
   only one bottom plate;
   only one hood, wherein said hood provides at an open end a perimeter sealing surface;
   means for non-positive locking of the hood to the bottom plate, said means for non-positive locking comprising a receptacle means secured to said hood and a latching means engaging said receptacle means and said bottom plate;
   means for sealing between said hood and said bottom plate, said means for sealing comprising a surface sealing lip joined to said bottom plate around an outer perimeter of said bottom plate, and extending laterally outward beyond said bottom plate in a cantilever fashion, said sealing lip pressed against said sealing surface when said container is closed; and
   means for securing semiconductor wafers inside said container, said means for securing mounted to an inside surface of said hood, said means for securing moved into securing position adjacent said wafers by contact from said bottom plate when said container is closed.

2. A container as defined in claim 1, wherein said means for securing semiconductor wafers inside said container comprises:
   a securing plate, movably mounted at a first pivot point to an inside surface of said hood, said first pivot point movable vertically in a direction of closure of said bottom plate, and laterally away from said inside surface toward the semiconductor wafers; and
   a guide plate movably connected to said securing plate at a second pivot point and in contact with said bottom plate at an impact point when said container is closed, said guide plate thrust vertically by said bottom plate in the direction of closure of said bottom plate to said hood, without lateral movement of said impact point with respect to said bottom plate, said bottom plate thrusting said first and second pivot points vertically in the direction of closure of said bottom plate, and laterally away from said inside surface of said hood toward the wafers.

3. A container as defined in claim 2, wherein a means for movably mounting said securing plate at said first pivot point to said hood for vertical and lateral movement comprises a connecting plate with a first and second film hinge on each end thereof, said first film hinge mounted to the inside surface of said hood and said second film hinge connected to said first pivot point; and a means for movably connecting said securing plate, at said second pivot point, to said guide plate, for vertical and lateral movement comprises a third film hinge.

4. A container as defined in claim 1, wherein said latching means comprises two locking levers and said receptacle means comprises two formed portions, each portion formed into opposite lateral sides of said hood.

5. A container as defined in claim 1, wherein when said container is nearly closed with said sealing lip approaching but not yet pressed against said sealing surface, said sealing lip has an inclined orientation, at least at a free end thereof, toward said sealing surface, said sealing lip has on an upper surface, an abutting surface area with a concave curvature facing said sealing surface, and when said sealing lip is pressed against said sealing surface during closure of the container said pressing causes said sealing lip to elastically deform from said inclined orientation to an orientation wherein said abutting surface area of said sealing lip conforms to said sealing surface, causing a sealed connection, said free end of said sealing lip maintaining resilient contact with said sealing surface upon closure of the container.

6. A container as defined in claim 5, wherein said sealing surface is inclined downwardly toward an inside of said container and toward said bottom plate.

7. A container as defined in claim 6, wherein after pressing of said sealing lip to said sealing surface, a thickness of said sealing lip when measured in a direction normal to said sealing surface, measured from said upper surface to a lower surface, tapers parabolically in an outward direction along said sealing lip; and before pressing of said sealing lip to said sealing surface, said upper and lower surfaces of said sealing lip have different curvatures.

8. A container as defined in claim 1, wherein at least one container component contains polypropylene.

9. A container as defined in claim 1, wherein at least one component contains polycarbonate.

10. A container as defined in claim 1, wherein the semiconductor wafer securing means is composed of polyethylene.

11. A container as defined in claim 1, wherein said container components are composed of an anti-static plastic.

12. A container for transporting and storing semiconductor wafers in processing cassettes, comprising:
 a bottom plate;
 a hood;
 means for sealing between said bottom plate an said hood; said means for sealing between said bottom plate and said hood comprising a surface-sealing lip joined to said bottom plate; part of said hood comprising a sealing surface; and said sealing lip pressing against said sealing surface when said container is closed;
 means for non-positive locking of said hood to said bottom plate said means for non-positive locking comprising a receptacle means secured to an outside of said hood and latching means which engage said receptacle means and said bottom plate when said container is non-positively locked;
 a fastening plate secured to an inside surface of said hood;
 a securing plate adjacent to the semiconductor wafers and movably connected by at least one film hinge to said fastening plate;
 a guide plate movably connected by at least one film hinge to said securing plate, and in non-sliding, point contact with said bottom plate during closure of said container, such contact causing said guide plate to move said securing plate laterally into securing position.

13. A container as defined in claim 12, wherein a thickness of said sealing lip when measured in a direction normal to said sealing surface, with said sealing lip pressing said sealing surface during closure of said container, tapers parabolically in an outward direction, and upper and lower surfaces of said sealing lip have different curvatures when said sealing lip is not yet pressed by and elastically deformed by said sealing surface, and when said container is in the nearly closed position with said sealing lip closely approaching but not elastically deformed by said sealing surface, a free end of said sealing lip is inclined relative to said sealing surface such that when said upper surface of said sealing lip is pressed against said sealing surface upon complete closure of said container said pressing causes said sealing lip to elastically deform from said inclined orientation to an orientation wherein an abutting area of said upper surface of said sealing lip resiliently presses substantially flush with said sealing surface causing a seal, said free end of said sealing lip maintaining resilient contact with said sealing surface.

14. A container as defined in claim 13, wherein said non-positive locking of said hood to said bottom latching means comprises two locking levers and said receptacle means comprises two formed portions, each portion formed into opposite lateral sides of said hood.

15. A container as claimed in claim 14, wherein when said container is closed, said sealing surface is inclined relative to the inside surface of said bottom plate.

16. A container as defined in claim 12, wherein at least one of said bottom plate, said hood, said means for sealing, said fastening plate, said securing plate, said guide plate, and said film hinges contains polypropylene.

17. A container as claimed in claim 12, wherein at least one of said bottom plate, said hood, said means for sealing, said fastening plate, said securing plate, said guide plate, and said film hinges contains polycarbonate.

18. A container as defined in claim 12, wherein said fastening plate, said securing plate, and said guide plate are all composed of polyethylene.

19. A container as defined in claim 12, wherein said bottom plate, said hood, said means for sealing, said fastening plate, said securing plate, said guide plate, and said film hinges are all composed of an anti-static plastic.

20. A container as defined in claim 5, wherein said sealing lip and said bottom plate are molded of one piece.

21. A container for transporting and storing semiconductor wafers in processing cassettes, comprising:
 a bottom plate;
 a hood, wherein said hood provides at an open end a perimeter sealing surface;
 means for non-positive locking of the hood to the bottom plate;
 a perimeter sealing lip secured around an outer perimeter of said bottom plate and aligned with said sealing surface when said bottom plate is mated to said hood, said sealing lip comprising a tapered cross section cantilevered outwardly from said bottom plate, said tapered cross section having a concave abutting surface area facing upwardly toward said approaching sealing surface just before pressing of said sealing lip to said sealing surface during mating of said hood to said bottom plate, a pressing of said sealing surface onto said sealing lip elastically deforming said sealing lip to open up said concave abutting surface area to elastically conform said concave abutting surface area to the sealing surface, causing an uninterrupted contact between said abutting surface area and said sealing surface.

22. A container as claimed in claim 21, wherein said tapered cross section is tapered parabolically from said bottom plate outwardly to a free end of said tapered cross section.

23. A container as claimed in claim 21, wherein said sealing surface is inclined with respect to the approaching direction of the sealing surface toward the sealing lip during closure of the container, having a downward inclination toward the inside of the container; and a free end of said tapered cross section is inclined upwardly at a rising angle greater than the downward inclination of the sealing surface toward the inside of the container.

24. A container as defined in claim 3, wherein said means for securing further comprises a fastening plate removably attached to said inside surface of said hood and wherein said connecting plate is mounted to said hood by connection of said first film hinge to said fastening plate.

25. A container as defined in claim 24, wherein said securing plate further comprises a third pivot point, said third pivot point connected to said fastening plate by a second connecting plate having a fourth and fifth film hinge arranged on opposite ends thereof, said fourth film hinge connected to said fastening plate and said fifth film hinge connected to said third pivot point.

26. A container for transporting and storing semiconductor wafers and processing cassettes, comprising:
   a bottom plate;
   a hood;
   means for non-positive locking of the hood to the bottom plate;
   a fastening plate removably fixedly mounted to an inside surface of said hood;
   a first connecting plate, having a first hinge and a second hinge disposed at opposite ends thereof;
   a securing plate arranged adjacent to the semiconductor wafers, said securing plate connected at a first pivot point by said second hinge, said first hinge connected to said fastening plate;
   a second connecting plate having a third hinge and a fourth hinge disposed on opposite ends thereof, said third hinge connected to said fastening plate and said fourth hinge connected to a second pivot point on said securing plate, said second pivot point located beneath said first pivot point along a length of said securing plate;
   a guide plate having a first end engageable with said bottom plate when said bottom plate is mated to said hood, said bottom plate thrusting said first end upward when said bottom plate is mated with said hood, and a second end connected by a fifth hinge to a third pivot point on said securing plate, said third pivot point located beneath said second pivot point, upward thrust of said first end causes said second end also to rise and swing, thrusting said securing plate upward and laterally toward said semiconductor wafers, said first connecting plate and said second connecting plate swinging upwardly allowing said securing plate to move upwardly, and said connecting plates forcing said securing plate to move laterally.

27. A container as defined in claim 26, wherein said guide plate is located between said securing plate and an inside surface of said hood, on a side of said securing plate opposite of said semiconductor wafers, when said container is loaded with the wafers and closed, said guide plate having a portion between said first end and said second end abutting said inside surface of said hood and holding said securing plate away from said inside surface of said hood a preset distance allowing a minimum clearance for loading the processing cassette without contact of the wafers with the securing plate, and before mating of said bottom plate to said hood, said first end also distanced by said portion from said inside surface of said hood to locate said first end for engagement with said bottom plate upon closure of said container.

28. A container as defined in claim 27, wherein said guide plate comprises a bent shape and said portion comprises a V-shape with a peak abutting said inside surface.

29. A container as defined in claim 26, wherein at least one of said first, second, third, fourth, and fifth hinges comprise a film hinge.

* * * * *